United States Patent
Wang et al.

[11] Patent Number: 5,991,192
[45] Date of Patent: Nov. 23, 1999

[54] CURRENT-MODE WRITE-CIRCUIT OF A STATIC RAM

[75] Inventors: Jinn-Shyan Wang, Chia-Yi; Wayne Tseng, Tainan; Hung-Yu Li, Ping-Tung Hsien, all of Taiwan

[73] Assignee: National Science Council of Republic of China, Taipei, Taiwan

[21] Appl. No.: 08/986,935

[22] Filed: Dec. 8, 1997

[51] Int. Cl.⁶ .................................................. G11C 7/00
[52] U.S. Cl. ............... 365/154; 365/189.01; 365/189.02; 365/203
[58] Field of Search .............................. 365/154, 189.01, 365/203, 189.05, 189.11, 189.02, 190

[56] References Cited

U.S. PATENT DOCUMENTS

| | | | |
|---|---|---|---|
| 4,858,181 | 8/1989 | Scharrer et al. ........................ | 365/154 |
| 5,272,668 | 12/1993 | Sugawara et al. ................. | 365/189.01 |
| 5,305,264 | 4/1994 | Takahashi ................................. | 365/190 |
| 5,432,736 | 7/1995 | Wong et al. ............................ | 365/154 |

*Primary Examiner*—Tan T. Nguyen
*Attorney, Agent, or Firm*—Dougherty & Troxell

[57] ABSTRACT

The present invention is related to a circuit of SRAM with current-mode write-circuits. The current-mode write-operation is through the equalization technique in advance to equalize the potential in the memory cell by using the equalization transistor. After the equalization operation, the current conveyor should pass the differential current of data into the memory cell in order to make the differential current to pull out the differential voltage through the memory cell's strong positive feedback. The present invention has seven transistors in the memory cell that is different from the conventional memory cell with six transistors. Besides, the size of each transistor can also be different from the conventional design.

6 Claims, 6 Drawing Sheets

CURRENT-MODE WRITE-CIRCUIT OF A STATIC RAM

BACKGROUND OF THE INVENTION

1. Field of the Invention

The present invention relates to use the differential current to proceed write operation on the circuit of SRAM that is different with the general write operation by using differential voltage. There is one more transistor in the new SRAM's memory cell than that in the conventional memory cell in which there are six transistors. The extra equalization transistor equalize the electric potential in the memory cell in advance, and then the differential current of input data is transmitted to memory cell through the current conveyor. In addition, the differential current going into the memory cell will be amplified by the strong positive feedback of the memory cell to pull out the differential voltage.

2. The Description of the Prior Art

In the past, the development of SRAM circuit is mainly using the different voltage-mode sense amplifier to increase the read-operation speed of the memory, as shown in Attachment 1. In the past few years, the related publications of current-mode SRAM utilized the current-mode read-operation as shown in Attachment 2. The current-mode read-operation can reduce the swing of bit-line, and it can not only increase the read speed, but also reduce the power loss of the bit-line which is usually loaded with large capacitance. Of course, it also reduces the power loss of entire memory. Although there is a current-mode read circuit, the data writing still depends on the voltage-mode circuit. The voltage mode write-operation should pull back the bit-lines to power supply $V_{dd}$, and the swing is almost equal to the power supply voltage ($V_{dd}$) in order to destroy and renew the original data in the memory cell. As it requires very large potential swing, there is large power loss when write the data into the memory, and also prolongs the memory cycle time. As the whole cycle time is the sum of one writing cycle time plus one reading cycle time, the operating speed of a general SRAM is not only limited by the reading time, but also limited by the cycle time.

SUMMARY OF THE INVENTION

The purpose of the present invention is to solve all problems that extended from the large swing of bit-line of writing cycle: the large power loss and the long cycle time of memory. The write-mode is using the differential current to renew the contents of the memory cell, and it doesn't require a nearly full voltage swing on the bit-line. So the input buffer and the size of gating transistor can be reduced as small as possible just in order to produce the difference current. In this design, the voltage swing of actual bit-line only requires 5% voltage of the power source (for example, when the voltage of power source is 3.3V, the swing of bit-line is only 0.2V). As this design doesn't require large swing of bit-line for the potential change, the bit-line load-transistor can be a fixed size, so the conventional technique of variable bit-line load is also not necessary. Due to the voltage swing is smaller, the potential of bit-line can be raised up to high potential ($V_{dd}$), and the cycle time of entire memory can be reduced largely. Besides, the power loss of capacity charge is $P=C*V^2*f$, so, under a fixed frequency f, the larger the effective capacity in the circuit, the larger the potential change V. Therefore, the power loss P is relatively large, and the squared V becomes more important. In general SRAM, the equivalent capacitance of bit-line is very large (e.g., 1PF–20PF). According to the conventional voltage-mode write-operation, and its V is very large (close to the voltage of power source $V_{dd}$), so the power loss is also raised up. Relatively, if applying the current-mode principle to the write circuit as in the present invention, the potential swing V can be reduced to about 5% of the voltage of the power source, in addition to go through the V square that can largely reduce the power loss again. As the entire write-operation depends on the difference current, so the transistor sizes of the memory cell can be adjusted additionally in order to make the layout area of the entire cell to be even denser and smaller.

The circuit of the present invention is mainly comprised of horizontal decoder, vertical decoder, address buffer, control circuit, output buffer and latch, read sense amplifier and multiplexer, equalization circuit of the cell, write-in current-conveyor and multiplexer, input circuit, and the cell array. As the design uses current-mode write-operation, the equalization circuit of the cell, write-in current-conveyor and multiplexer, input circuit, and the cell array are harmony with this design. The other parts are same as general SRAM. The equalization circuit of the cell is in charge of generating the signal to control the cell equalizing operation. The write-in current-conveyor and multiplexer is in charge of transmitting the differential current of input data to the appropriate bit-lines. The input circuit generates the difference current, and the memory cell is comprised by seven transistors that has one more transistor than the conventional six-transistors.

BRIEF DESCRIPTION OF THE DRAWINGS

The drawings disclose an illustrative embodiment of the present invention which serves to exemplify the various advantages and objects hereof, and are as follows.

The Illustration of Symbols.

| | |
|---|---|
| 10 | Horizontal Decoder |
| 11 | Vertical Decoder |
| 12 | Address Buffer |
| 13 | Word-line |
| 14 | Control Line |
| 15 | Control Circuit |
| 16 | Cell Array |
| 17 | Bit Lines |
| 18 | Writing Multiplexer |
| 19 | Local Data-Lines |
| 110 | Input Buffer |
| 111 | Sense Amplifier and Multiplexer |
| 112 | Output Buffer and Latch |
| 113 | Address Bus |
| 114 | Control Bus |
| 115 | Input Data Bus |
| 116 | Output Data Bus |
| 20 | equalization circuit of the cell |
| 21 | Cell Array |

-continued

The Illustration of Symbols:

| | |
|---|---|
| 22 | Write-In Current-Conveyer and multiplexs |
| 23 | Input Circuit |
| 24 | Signal Line we |
| 25 | Signal Line id |
| 31 | PMOS |
| 32 | NMOS |
| 33 | NMOS |
| 34 | NMOS |
| 35 | NMOS |
| 36 | NMOS |
| 37 | NMOS |
| 38 | Signal line wdln |
| 39 | Signal line wdlp |
| 40 | Signal line blp |
| 41 | NMOS |
| 42 | NMOS |
| 43 | Signal line wy |
| 44 | Signal line blp |
| 45 | NMOS |
| 46 | NMOS |
| 50 | Signal line word |
| 51 | PMOS |
| 52 | Mp |
| 53 | Mn |
| 54 | NMOS |
| 55 | Signal line weq |
| 56 | Mp |
| 57 | Mn |
| 58 | PMOS |
| 60 | NMOS |
| 61 | PMOS |
| 62 | NMOS |

DETAILED DESCRIPTION OF THE PREFERRED EMBODIMENT

Figure 1:
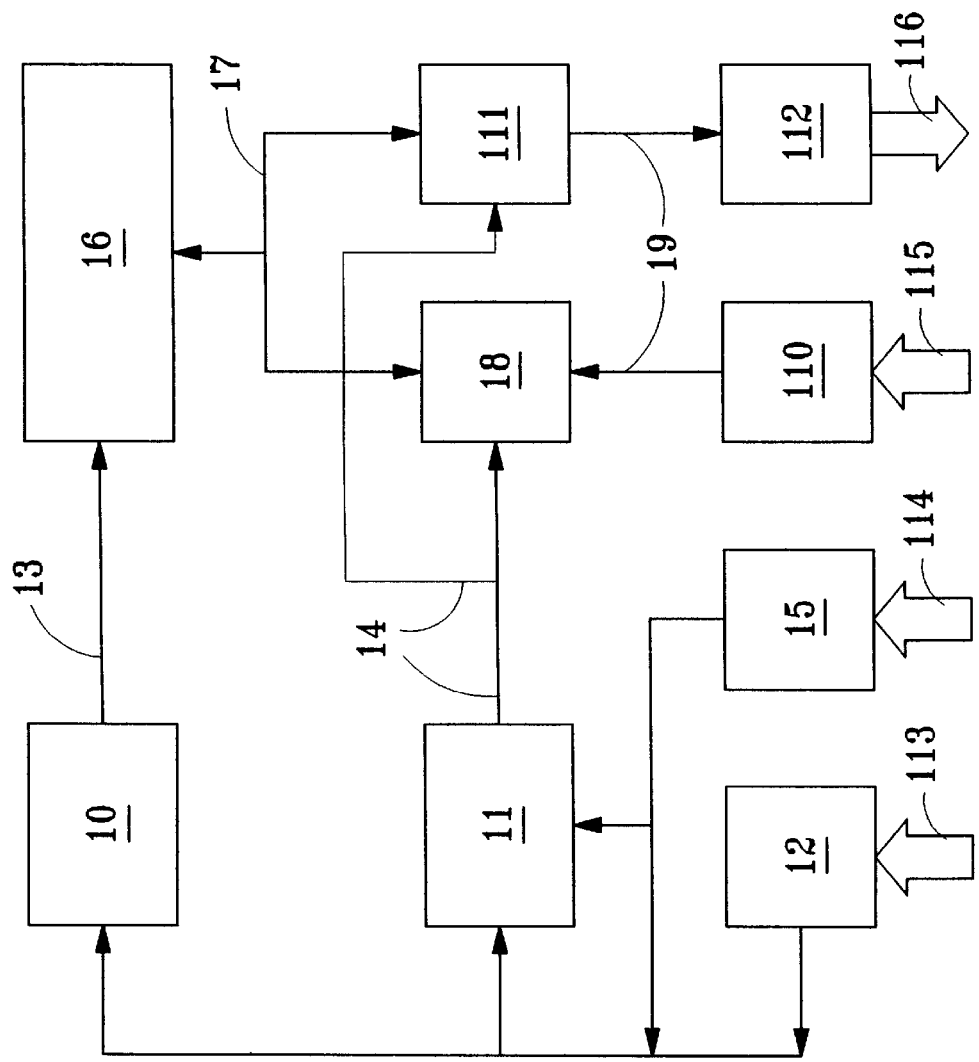
FIG. 1 is the block diagram of the circuit of conventional SRAM.

Refer to FIG. 1 is the circuit block diagram of the conventional SRAM. When writing the data, the control signal is transmitted to the control circuit 15 through the control bus 114, and then to control the horizontal decoder 100 and vertical decoder 11. The address signal will be transmitted through address bus 113 to address buffer 12, and then is transmitted to the horizontal decoder 10 and vertical decoder 11, respectively. The horizontal decoder 10 transmits the horizontal address information to the cell array 16 through wordline 13. However, the vertical decoder 11 will transmit the vertical address information to the writing multiplexer 18 via control line 14. The data will be transmitted to the input buffer 110 via input data bus, and go through local data-lines 19 to transmit to writing multiplexer 18. Through the bit-line 17 to write the vertical address information and data to the cell array 16. When reading data, the control signal is transmitted to the control circuit 15 through the control bus 114, and then transmit the signal to control the horizontal decoder 10 and vertical decoder 11, respectively. The address information will be transmitted through address bus 113 and address buffer 12, so the horizontal address information will be transmitted to the horizontal decoder 10, and then transmitted to the cell array 16 through word-line 13. On the other hand, the vertical address information will be transmitted to the vertical decoder 11 through control line 14 to the sense amplifier and multiplexer 111, and then transmitted to the cell array 16 through bit-line 17 to read the data. The read-data will be transmitted to the sense amplifier and multiplexer 111 via bit-line 17, and then output the data through output buffer & latch 112 and output data bus 116.

Figure 2:
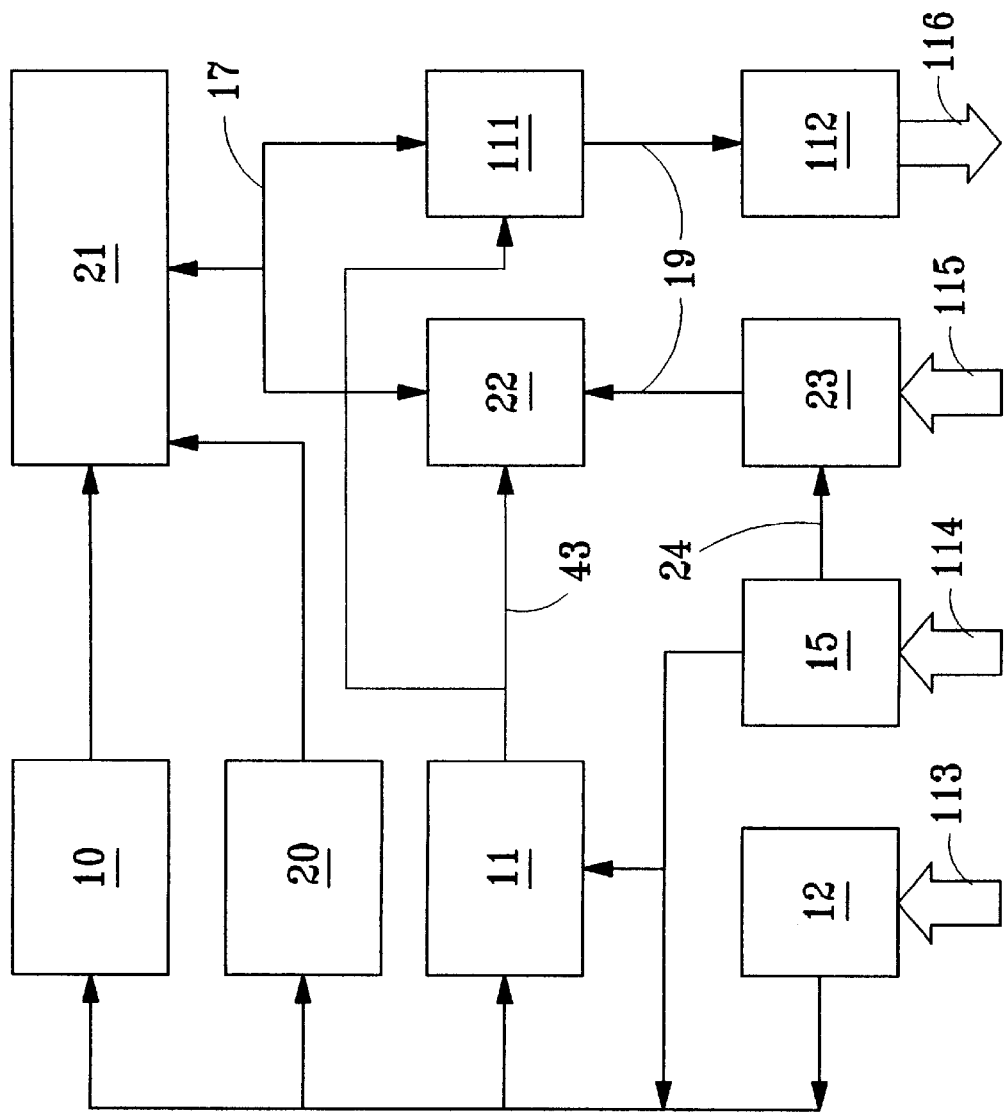
FIG. 2 is the block diagram of the circuit of the present invention.

Please refer to FIG. 2, which is the circuit block diagram of SRAM of the present invention. The method of reading data is same as the conventional SRAM, but the write method is changed to current-mode, so the hardware needs to be modified. The different parts includes cell array 21, write-in current-conveyor and multiplexer 22, input circuit 23 and equalization circuit of the cell 20. When write data, the address signal and control signal will be transmitted to the horizontal decoder 10, the vertical decoder 11 and the equalization circuit of the cell 20. The horizontal decoder will transmit the horizontal signal to the cell array 21, and the vertical decoder will transmit the vertical signal to the write-in current-conveyor/multiplexer 22 through signal line wy 43. However, the input data will be transmitted to the input circuit 23 through input data bus 115, and then the input circuit will generate difference current. The write-in current-conveyor/multiplexer 22 will transmit the differential current to the appropriate bit-line 17, and then to the cell array 21. The cell array of the present invention is comprised by seven transistors, and the equalization circuit of the cell is responsible to generate the signal to control the equalized operation of the cell.

Figure 3:
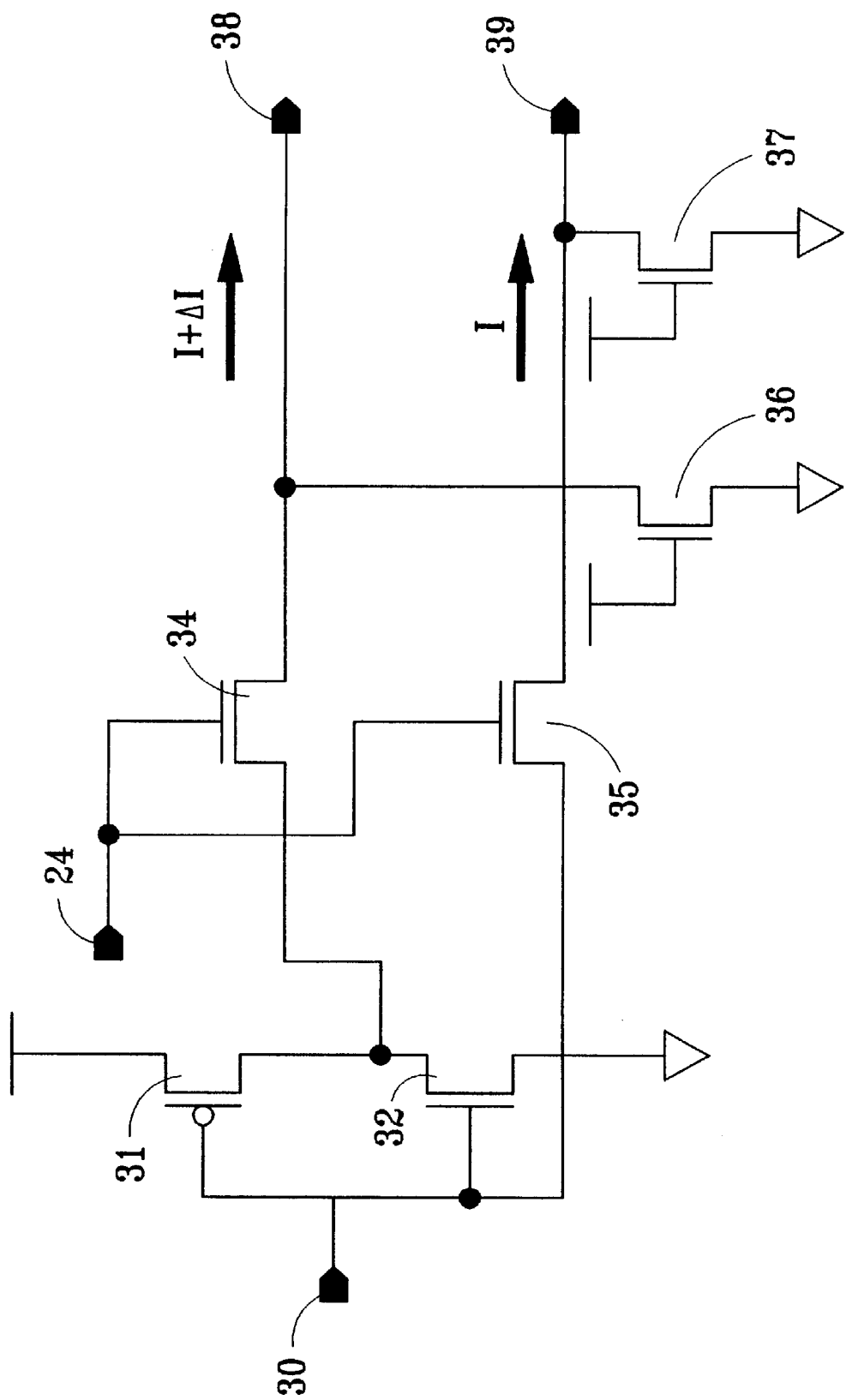
FIG. 3 is the schematic diagram of the input circuit of the present invention.

As shown in FIG. 3 is the schematic diagram of input circuit. The PMOS 31 and NMOS 32 construct an inverter. When the signal line id 30 input the data signal, this inverter will generate a relatively differential-action signal. When the signal line we 24 raise to the high potential, it will turn on NMOS 34 and NMOS 35, and the data can be transmitted to the signal line wdlf 39 and the signal line wdln 38. However, the NMOS 36 and NMOS 37 is a pair of load transistor which are in charge to pull the potential of signal line wdip 39 and signal line wdln 38 down to close to zero voltage in order to create the differential current$\Delta I$ for the signal line wdlp 39 and signal line wdin 38.

Figure 4:
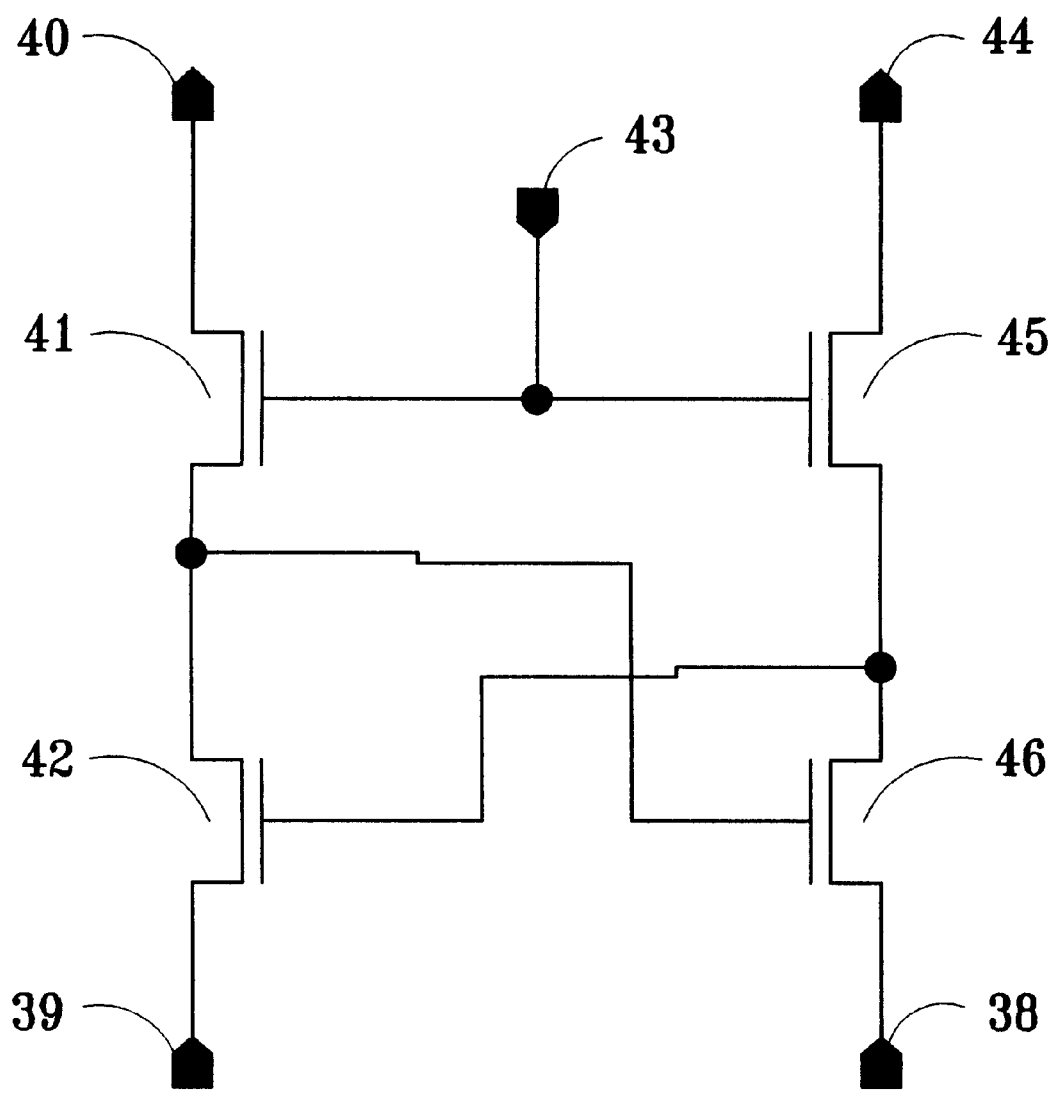
FIG. 4 is the schematic diagram of the write-in current-conveyor of the present invention.

FIG. 4 is the schematic diagram of write-in current-conveyor of the present invention, which is comprised by four NMOS (41, 42, 45, and 46). When full differential current shows on the signal line wdip 39 and signal line wdin 38, the signal line wy 43 will raise to high potential in order to turn on NMOS (41, 45) for the differential current flow to the signal line bln 44 and signal line blp 40.

Figure 5:
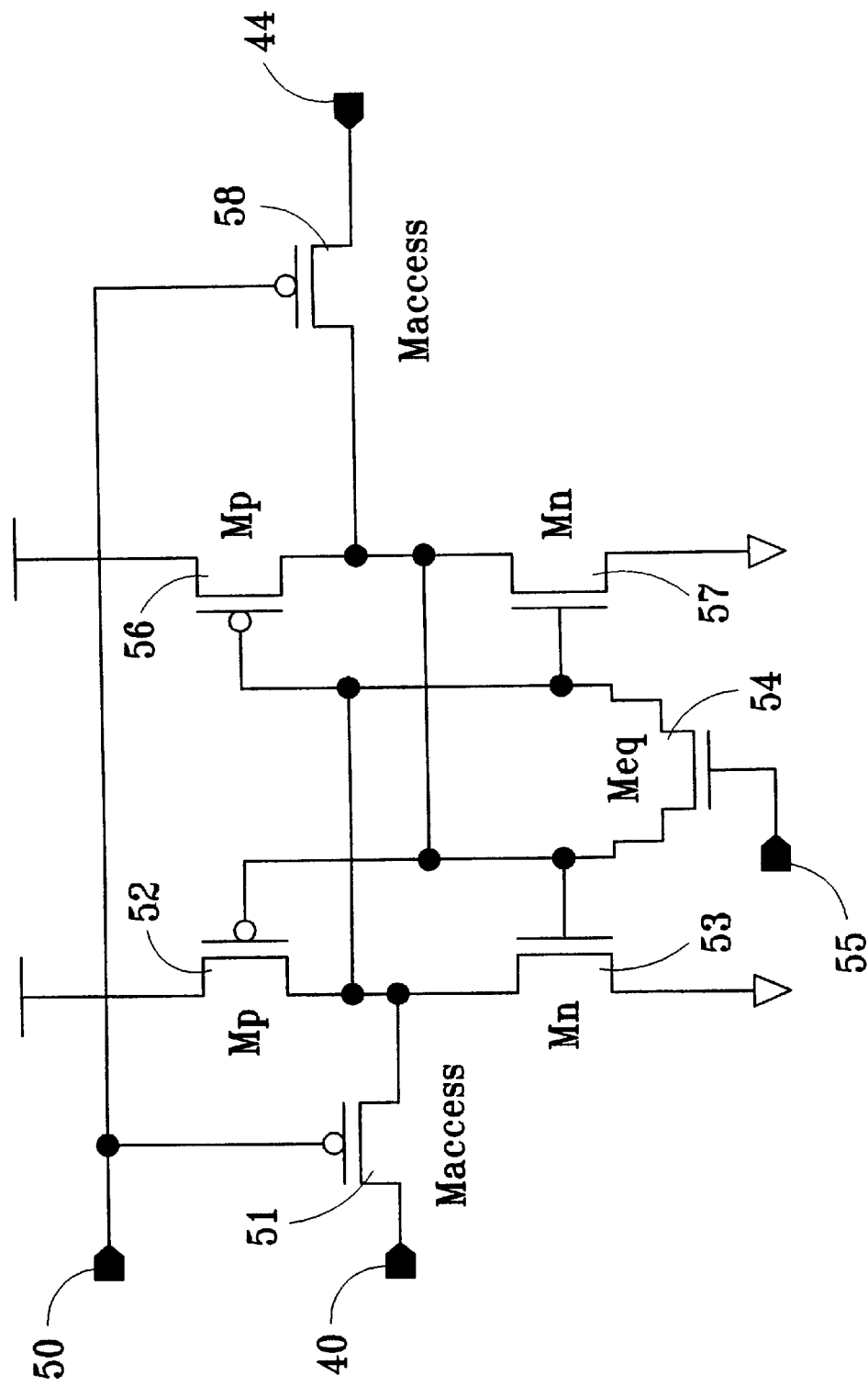
FIG. 5 is the schematic diagram of the memory cell of the present invention.

FIG. 5 is the schematic diagram of memory cell of the present invention, which is comprised by seven transistors. The NMOS 54 is an equalized transistor Meq, and PMOS51 & PMOS58 are Maccess transistors. The equalized transistor Meq and Maccess transistor can be PMOS or NMOS, so the FIG. 5 only shows one of the four possible combinations. Before the differential current has been transmitted to the signal line bin 44 and signal line blp 40, the signal line weq 55 should be raised to high potential in order to equalize the potential of two coupling inverters (Mp 52, Mn 53, Mp 56, and Mn 57). When equalize the two inverters, the signal line word 50 can be drop to low potential in order to turn on PMOS 51 and PMOS 58. Thus, the current will flow to the cells of (MP 52, Mn 53, Mp 56, and Mn 57). When the differential current flows to the memory cell, the signal line weq 50 can go high in order to pull out the differential current by the cell's positive feedback. Then, the signal line weq 50 goes low again to finish an operation of memory writing cycle.

Figure 6:
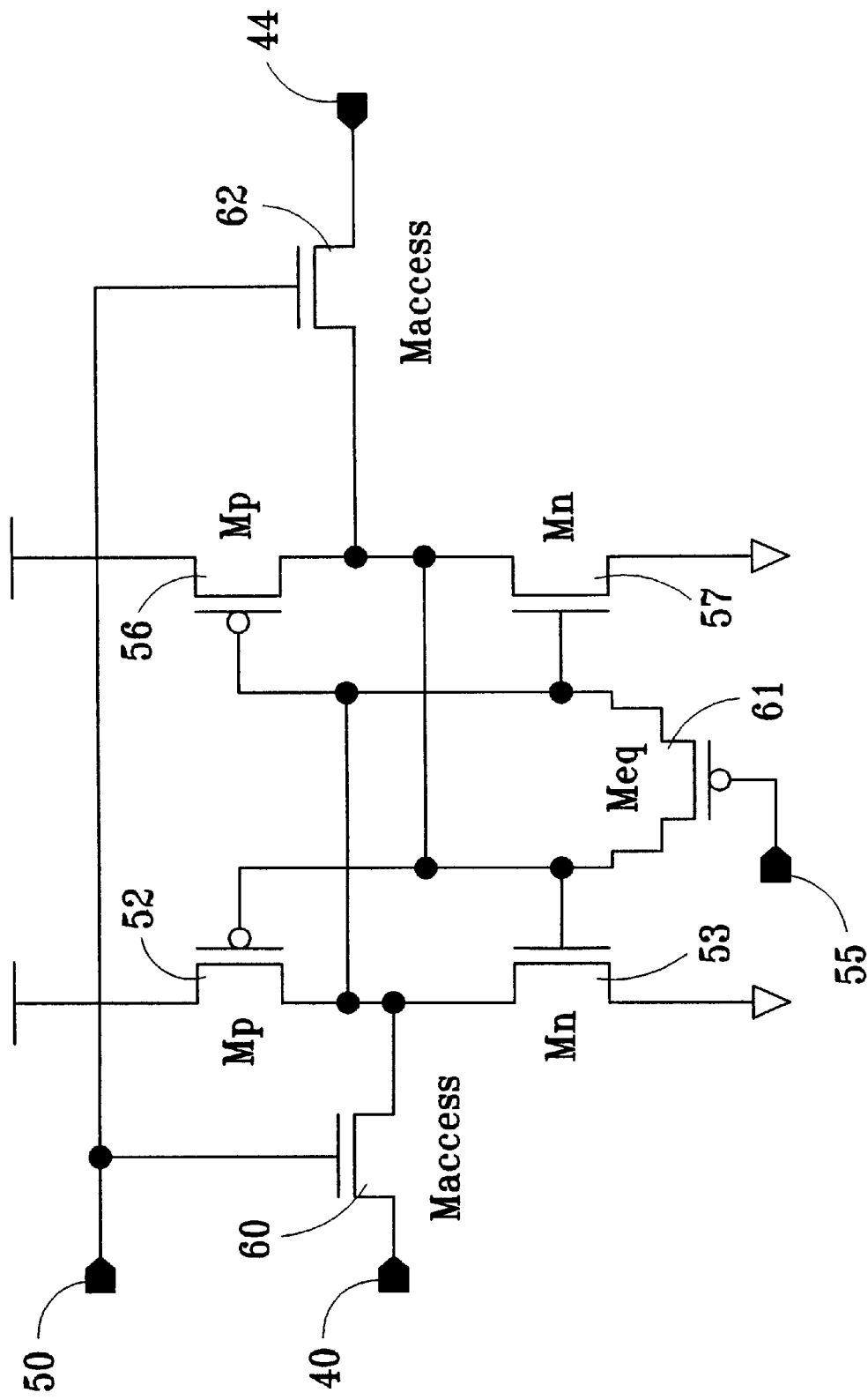
FIG. 6 is the schematic diagram of the another structure of the memory cell of the present invention.

As shown in FIG. 6 is another structure of the schematic diagram of memory cell of the present invention. It only changes the NMOS 54 of FIG. 5 to PMOS 61 and changes the PMOS 58 to NMOS 60 & NMOS 62. The working principal is similar as the structure of FIG. 5, but the potential of signal providing energy from signal line word 50 and signal line weq 55 have been changed.

Table 1 shows the comparison of "voltage write-in and current read-out" memory and "current write-in and current write-out" under the same size of 128×8 bits using the general production process of 0.6 μm CMOS. However, the basis of comparison is under almost equal read-write speed to compare the power loss separately. The definition of "write-in time" is from the time when the system clock is at 0.5V to the time when the potential of memory cell raises up to "$V_{DD}$–0.67V" or drops to 0.33V.

TABLE 1

The Comparison of Voltage Write-in and Current Write-in

| Methods | Write-in time | Read-out time | Biline swing | Average current loss | Power loss | Relative power loss |
|---|---|---|---|---|---|---|
| Voltage write-in | 4.74 ns | 5.71 ns | 2.31 volt | 9.28 mA | 306 μW/MHz | 1 |
| Current write-in | 3.95 ns | 5.94 ns | 0.14 volt | 2.81 mA | 93 μW/MHz | 0.3 |

Many changes and modifications in the above-described embodiment of the invention can, of course, be carried out without departing from the scope thereof Accordingly, to promote the progress in science and the useful arts, the invention is disclosed and is intended to be limited only by the scope of the appended claims.

What is claimed is:

1. A circuit of current-write mode of SRAM comprising: a cell array, a horizontal decoder, a vertical decoder, an equalization circuit of the cell array, an address buffer, a control circuit, an input circuit, an output buffer and latch, a write-in current-conveyor and multiplexer, a sense amplifier and multiplexer wherein: an input signal representing outside data is input through an input data bus, and through the input circuit to create a pair of current signals, one having the same phase and one having a reverse phase with the input signal; the control circuit controls a write-in time in order to transmit the input signal to the current-conveyor and multiplexer, and address information from the horizontal decoder and vertical decoder goes through a pair of bit-line to transmit the data to a selected new memory cell in the cell array, wherein the input circuit uses an inverter to generate the pair of same phase and reverse phase signals which are transmitted to a data line such that a pair load on the data line drops the potential of the data line to approximately zero voltage in order to create a differential current$\Delta I$ for the pair of same phase and reverse phase signals on the data line, thus, the size of transistor in the circuit can be the smallest size for a production process.

2. A circuit of current-write mode of SRAM as claimed in claim 1, wherein the current-conveyor and multiplexer comprises four NMOS transistors such that the input signal is input to first MOS and second MOS, wherein the gate of the first MOS connects to the drain of the second of the MOS and the source of the third MOS; the gate of the second MOS connects to the drain of the first MOS and the source of the third MOS; the gate of third MOS and the fourth MOS receive a plurality of signals such that they become column-selection signals of cell array in order to select one line from a multiple lines array to allow a signal to go through; and the third NMOS and the fourth NMOS are approximately equal to the multiplexer, and its drain is the output end.

3. A circuit of current-write mode of SRAM as claimed in claim 1, wherein the cell array is comprised by the new type memory cell.

4. A cell array as claimed in claim 3, wherein the new type memory cell is comprised by seven transistors four transistors forming two back to back CMOS inverters, and another two transistors for saving and retrieving purposes that connects to the output of the above mentioned inverters and the bit-line separately; and a final transistor is an equalization transistor whose source and drain terminals are connected to the output of the above mentioned inverters respectively; such that when it is turned on, the output of the inverters are in an equalization status.

5. A new type memory cell as claimed in claim 4 which the equalization transistor and save-retrieved transistor are selected from a group consisting of PMOS or NMOS transistors.

6. A circuit of current-write mode of SRAM as claimed in claim 1, wherein the cell equalization circuit is controlled by the control circuit, and sends out a signal to make the cell equalization circuit turn on before the bit-line transmits data into the selected new memory cell, and to make the output of the inverter in an equalization status.

* * * * *